United States Patent
Katayama

(10) Patent No.: US 8,902,636 B2
(45) Date of Patent: Dec. 2, 2014

(54) RESISTANCE CHANGE MEMORY

(71) Applicant: Akira Katayama, Seoul (KR)

(72) Inventor: Akira Katayama, Seoul (KR)

( * ) Notice: Subject to any disclaimer, the term of this patent is extended or adjusted under 35 U.S.C. 154(b) by 0 days.

(21) Appl. No.: 14/014,202

(22) Filed: Aug. 29, 2013

(65) Prior Publication Data
US 2014/0286078 A1    Sep. 25, 2014

Related U.S. Application Data

(60) Provisional application No. 61/804,551, filed on Mar. 22, 2013.

(51) Int. Cl.
| G11C 11/00 | (2006.01) |
| G11C 13/00 | (2006.01) |
| G11C 11/15 | (2006.01) |

(52) U.S. Cl.
CPC ............ *G11C 13/0069* (2013.01); *G11C 11/15* (2013.01)
USPC .......................................... 365/148; 365/158

(58) Field of Classification Search
USPC .................................. 365/148, 158
See application file for complete search history.

(56) References Cited

U.S. PATENT DOCUMENTS

| 8,705,303 B2* | 4/2014 | Ogawa et al. ................. 365/203 |
| 2006/0044867 A1 | 3/2006 | Ise |
| 2006/0120142 A1 | 6/2006 | Yamagami |
| 2007/0206403 A1 | 9/2007 | Shirahama et al. |
| 2009/0091969 A1 | 4/2009 | Ueda |
| 2011/0157966 A1 | 6/2011 | Lee |

FOREIGN PATENT DOCUMENTS

JP        08-315580 A    11/1996

OTHER PUBLICATIONS

David Halupka et al.; "Negative-Resistance Read and Write Schemes for STT-MRAM in 0.13 μm CMOS"; 2010 IEEE International Solid-State Circuits Conference; pp. 256-258.
International Search Report including Written Opinion dated Apr. 15, 2014 in parent International Application No. PCT/JP2014/057023.

* cited by examiner

*Primary Examiner* — Michael Tran
(74) *Attorney, Agent, or Firm* — Holtz, Holtz, Goodman & Chick PC

(57) ABSTRACT

According to one embodiment, a memory includes a resistance change element connected between first and second conductive lines, a write buffer which writes data in the resistance change element by flowing a write current to the resistance change element through the first and second conductive lines in a writing, a current/voltage converter which converts the write current into a sense voltage, the converter provided in the write buffer, the write buffer being non-activated when the sense voltage is larger than a first threshold value.

13 Claims, 15 Drawing Sheets

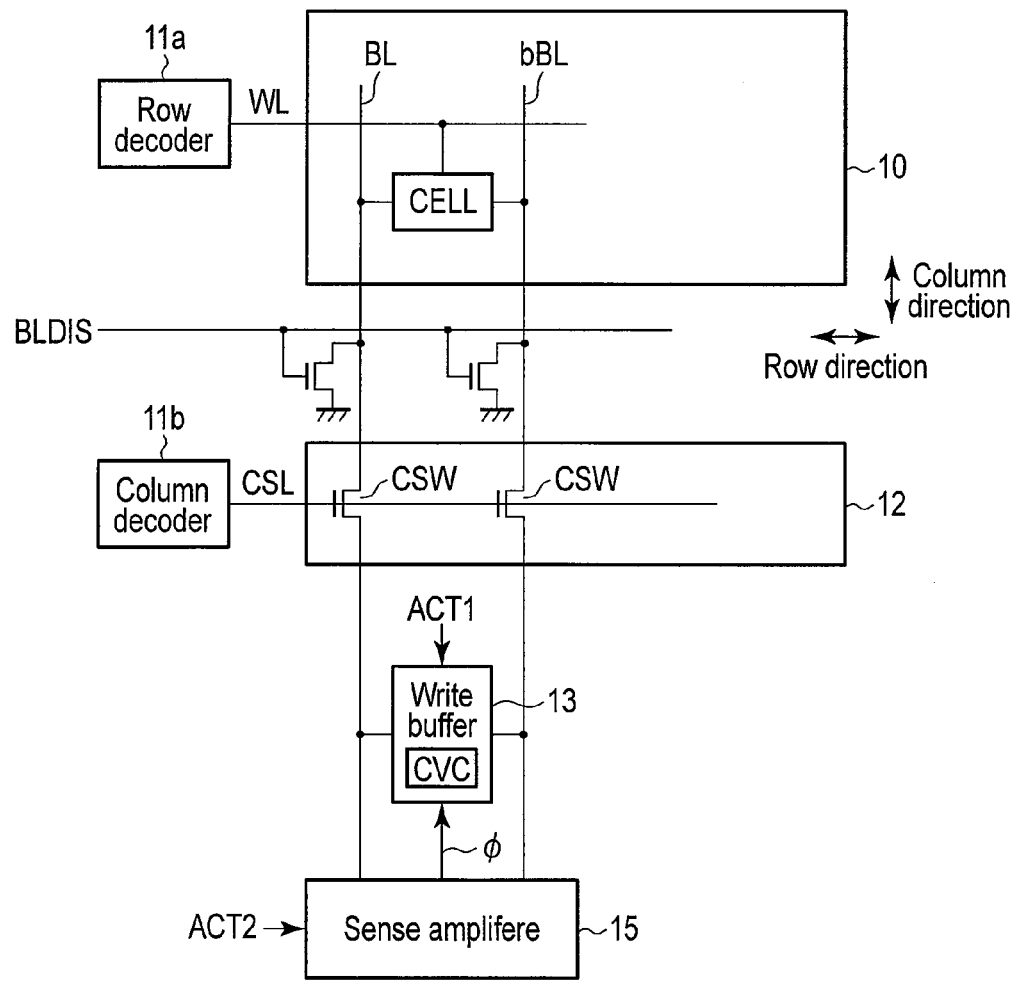
F I G. 2

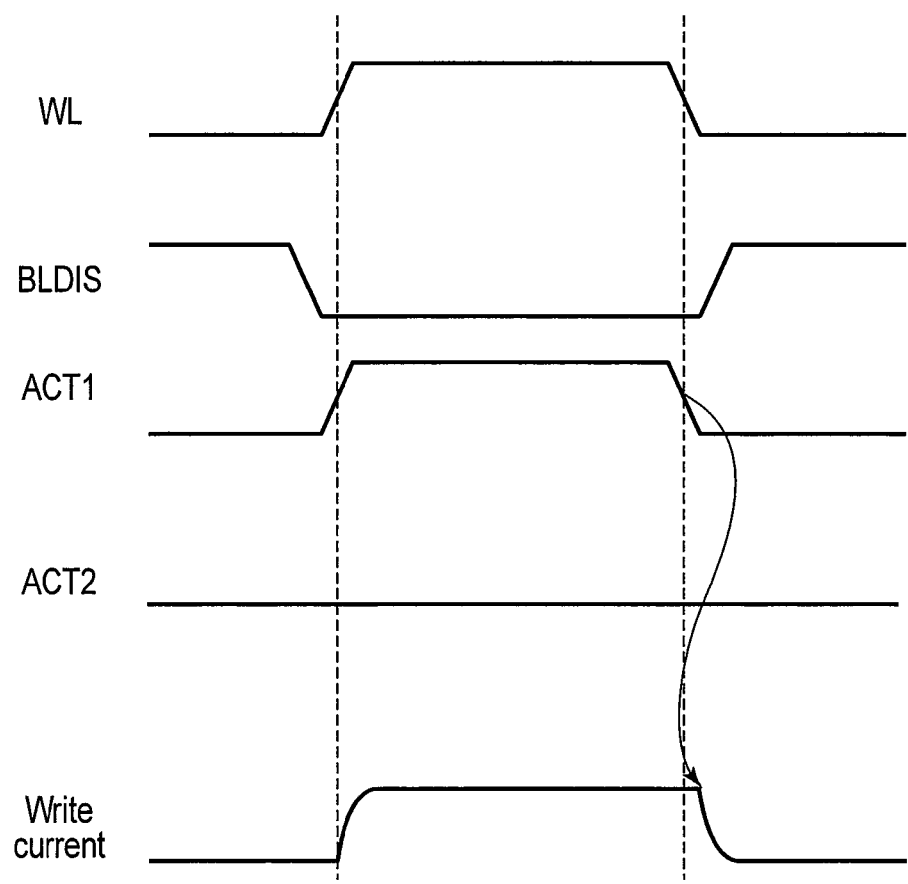
F I G. 4

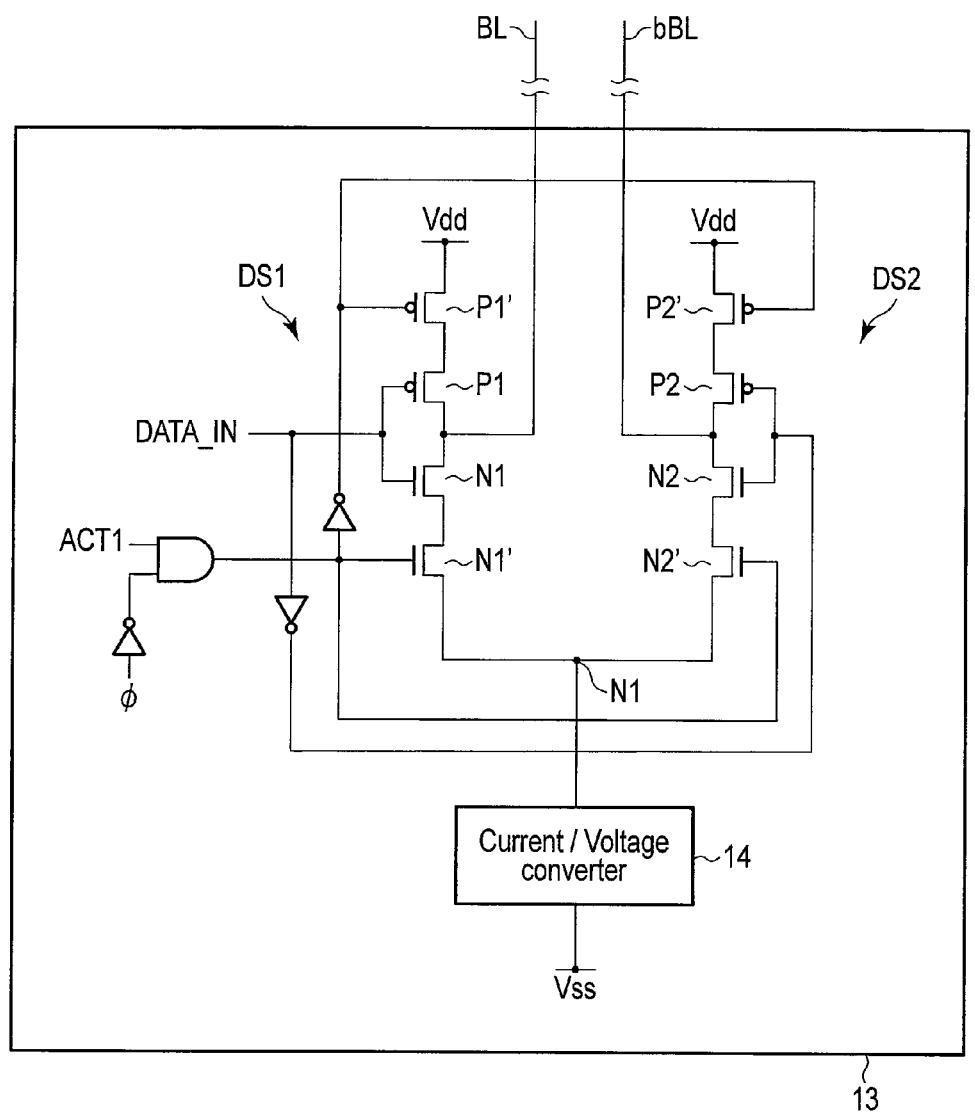
F I G. 5A

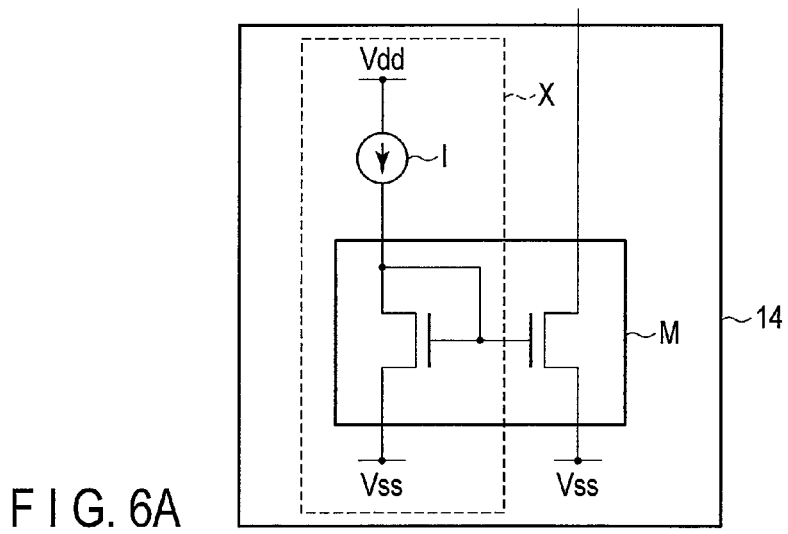
F I G. 6A
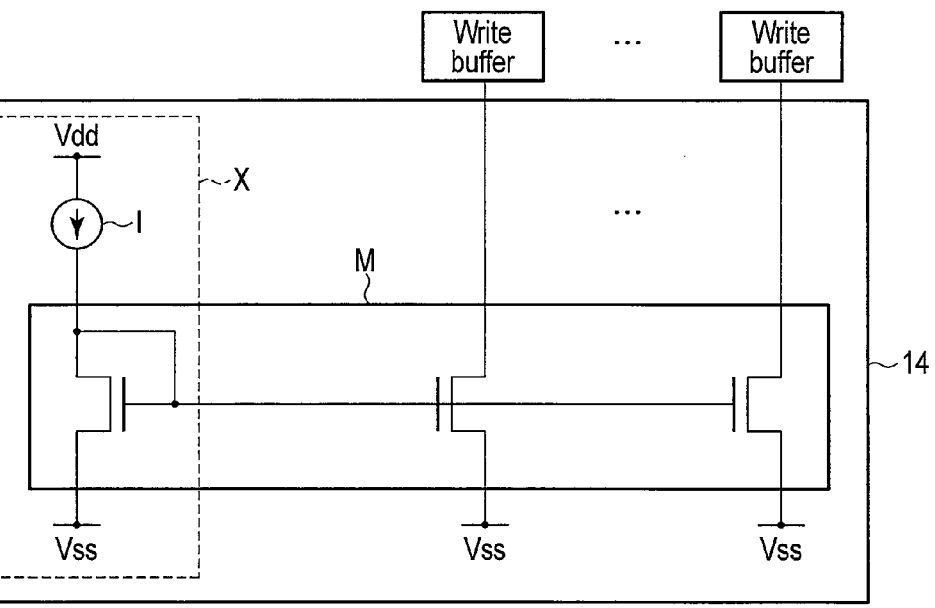
F I G. 6B
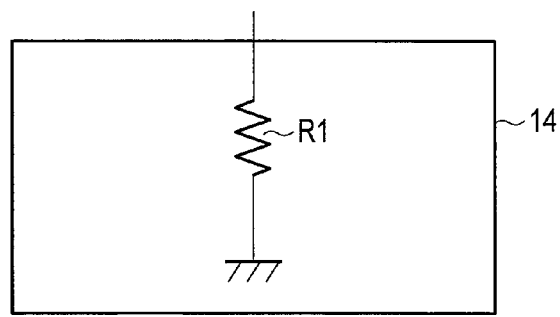
F I G. 7

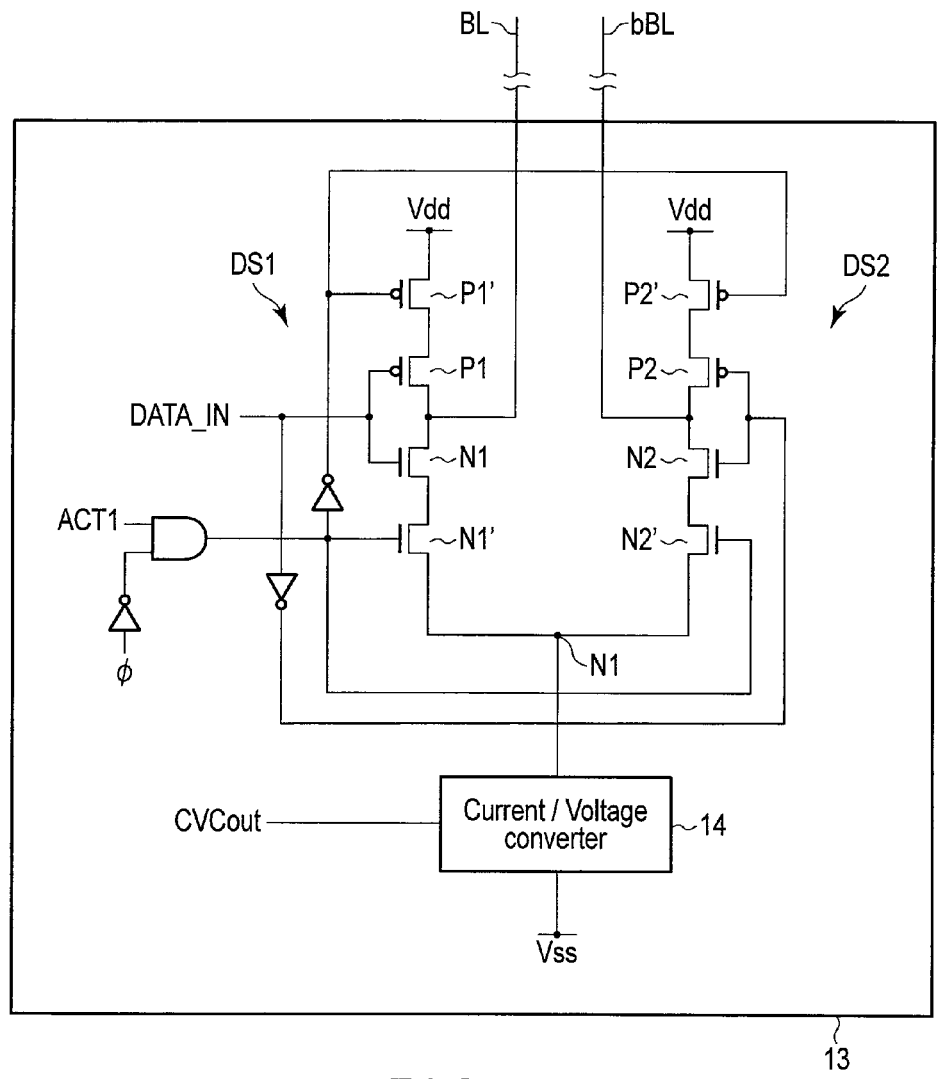
F I G. 8A

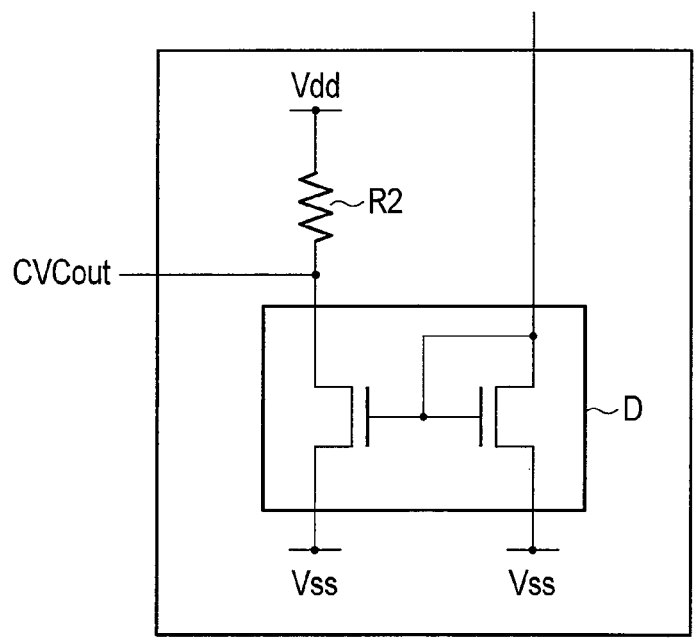
F I G. 8B
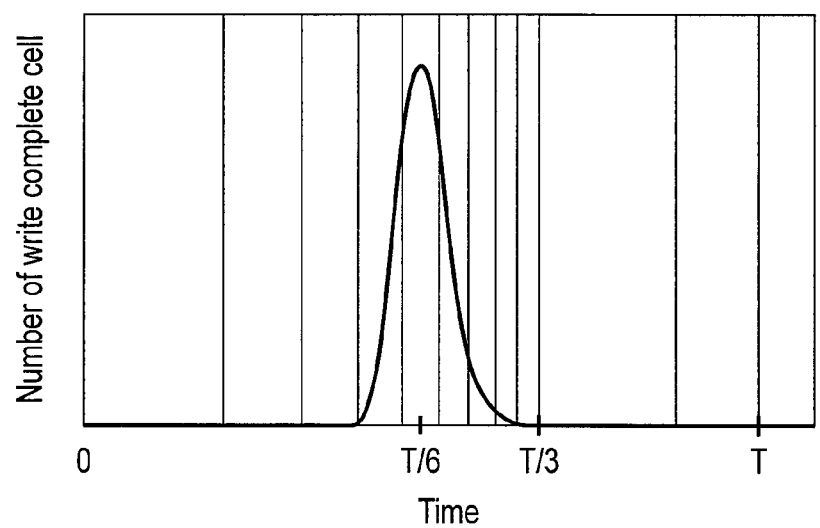
F I G. 9

| | Number of sense points | Sense points | Power estimation (All flip) | Power estimation (Half flip) |
|---|---|---|---|---|
| Conventional | 0 | No | 100% | 100% |
| Proposed_1 | 1 | T/3 | 33% | 33% |
| Proposed_2 | 2 | T/6, T/3 | 26% | 22% |
| Proposed_3 | 3 | 0, T/6, T/3 | 26% | 13% |

F I G. 10

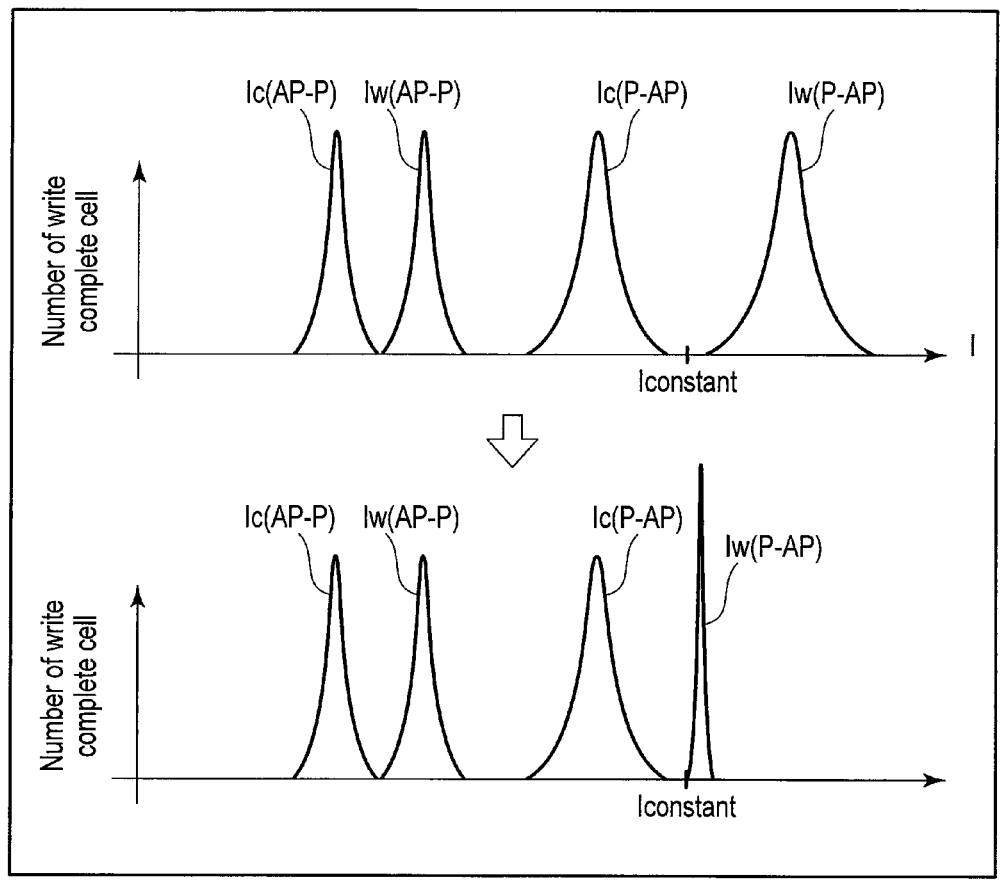
F I G. 11

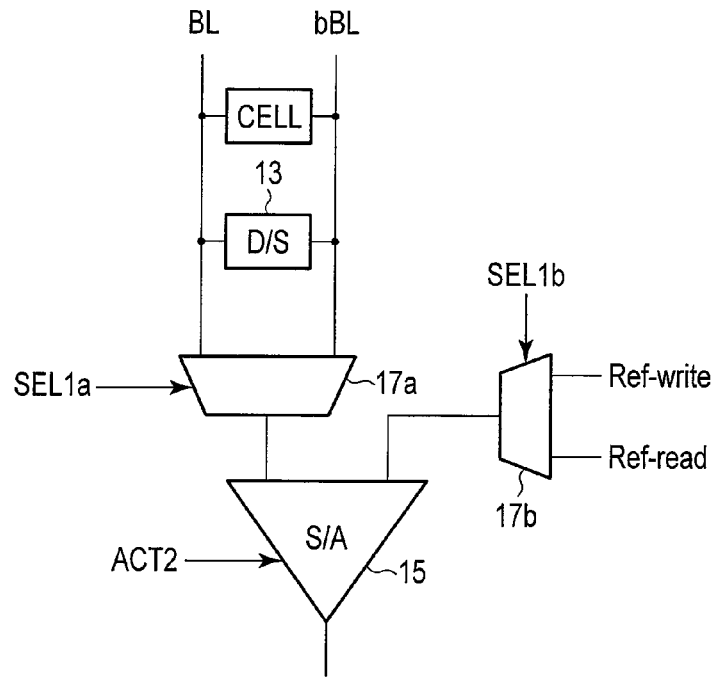
F I G. 12
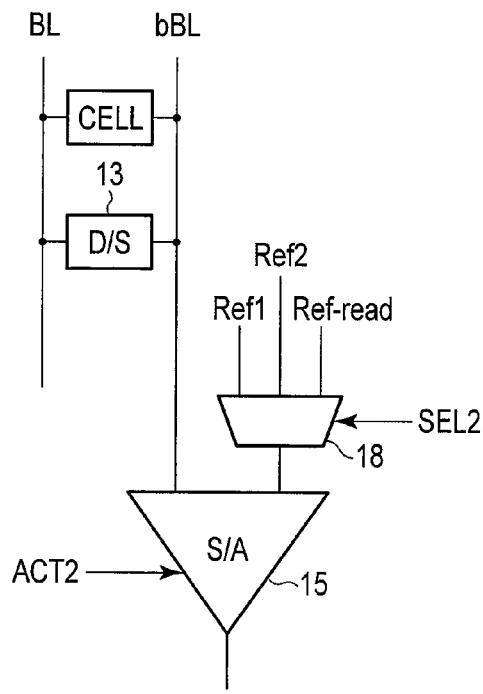
F I G. 13

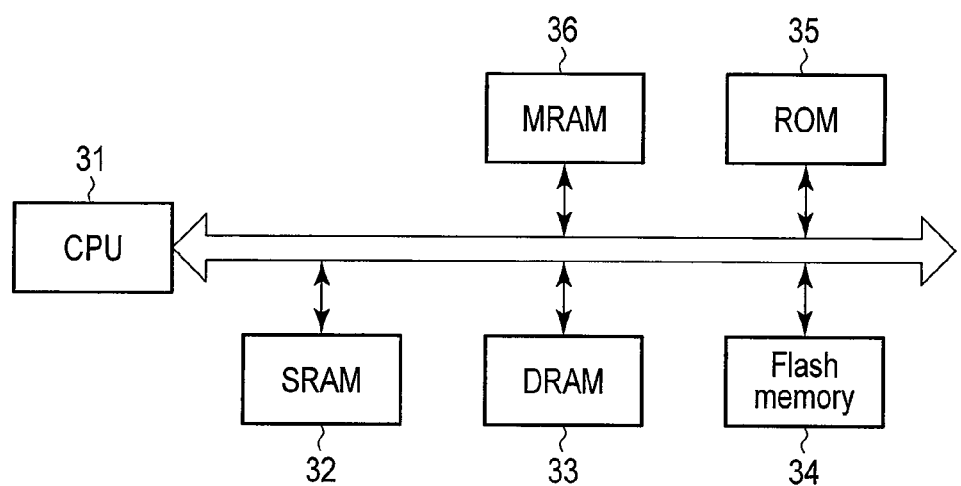
F I G. 14

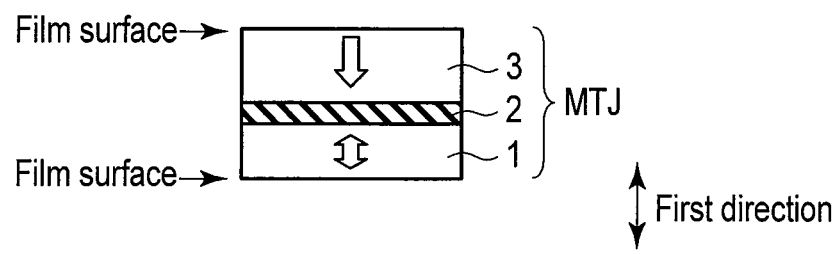
F I G. 15
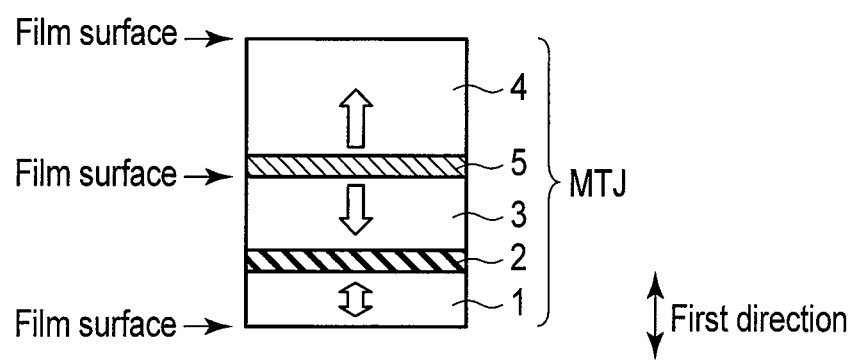
F I G. 16

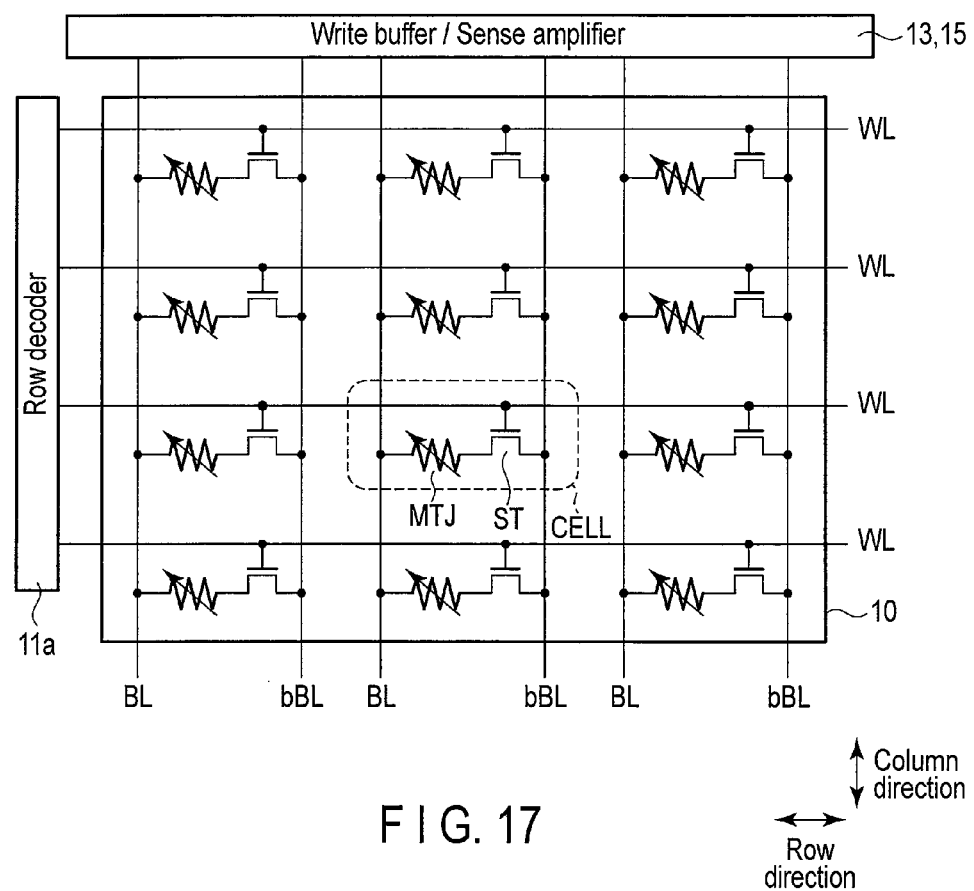
F I G. 17

RESISTANCE CHANGE MEMORY

CROSS-REFERENCE TO RELATED APPLICATIONS

This application claims the benefit of U.S. Provisional Application No. 61/804,551, filed Mar. 22, 2013, the entire contents of which are incorporated herein by reference.

FIELD

Embodiments described herein relate generally to a resistance change memory.

BACKGROUND

It has been considered to apply a resistance change memory such as a magnetic random access memory (MRAM) to, for example, a cache memory of a microcomputer (processor) designed to consume a low current, as a nonvolatile and high-speed memory. However, the resistance change memory wastefully consumes a write current in a write operation. For example, although memory cells vary in write time, the write time is constant in all the memory cells.

Therefore, the write time is set to a time sufficient to complete writings in all the memory cells. In this case, within the write time, a wasteful write current flows through memory cells requiring no writings (memory cells having data unchanged before and after a writing) and through memory cells which have completed writings earlier.

BRIEF DESCRIPTION OF THE DRAWINGS

FIG. 2 is a diagram showing the relation between a memory cell array, a write buffer, and a sense amplifier;
FIG. 4 is a diagram showing operating waveforms according to a comparative example;
FIGS. 5A and 5B are a diagram showing a configuration example of the write buffer;
FIGS. 6A, 6B, 7, 8A and 8B are diagrams showing configuration examples of a current/voltage converter;
FIG. 9 is a graph showing the relation between a write time and the number of write complete cells;
FIG. 10 is a table showing sense points and the reduction of power consumption;
FIG. 11 is a diagram showing current limitation at the sense points;
FIG. 12 and FIG. 13 are diagrams showing configuration examples of the sense amplifier;
FIG. 14 is a diagram showing a nonvolatile cache system;
FIG. 15 and FIG. 16 are diagrams showing examples of magnetoresistive effect elements;
and
FIG. 17 is a diagram showing an example of a memory cell array of an MRAM.

DETAILED DESCRIPTION

Figure 1:
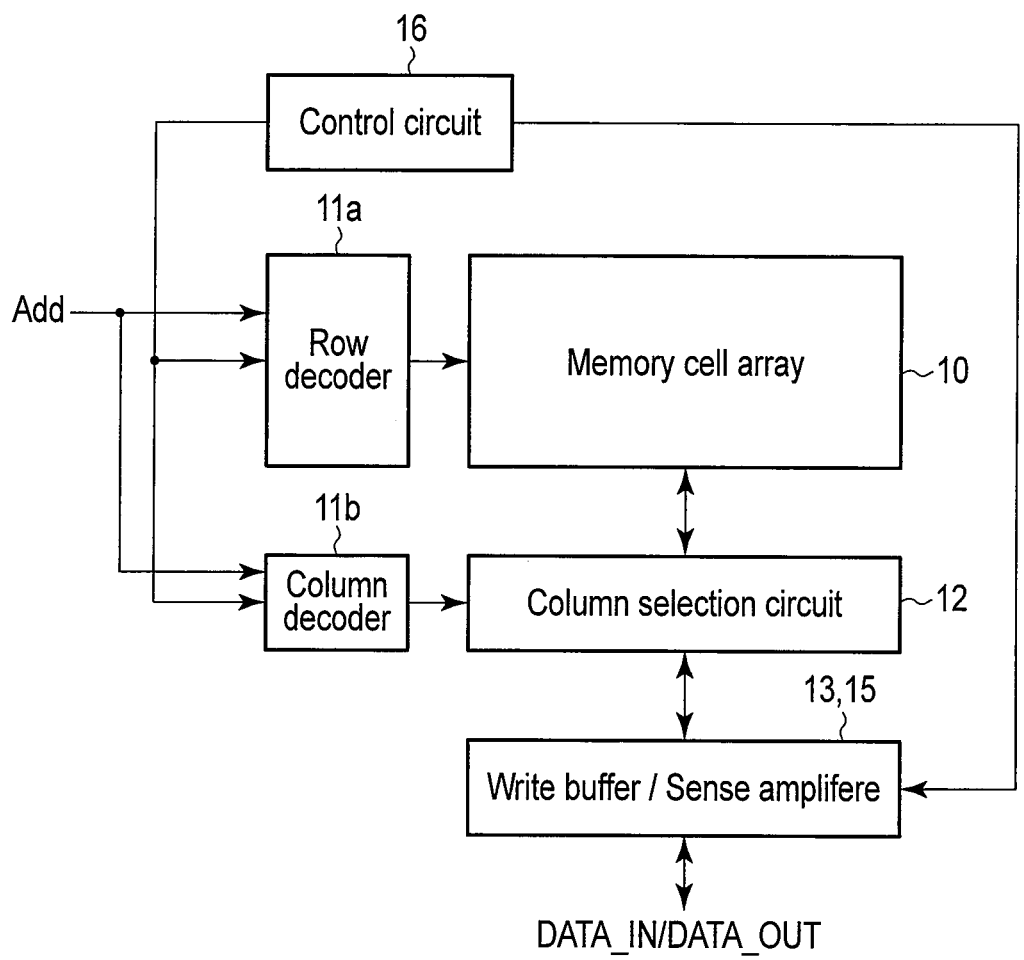
FIG. 1 is a general view of a resistance change memory.

In general, according to one embodiment, a resistance change memory comprises: a resistance change element connected between first and second conductive lines; a write buffer which writes data in the resistance change element by flowing a write current to the resistance change element through the first and second conductive lines in a writing; a current/voltage converter which converts the write current into a sense voltage, the converter provided in the write buffer, the write buffer being non-activated when the sense voltage is larger than a first threshold value.

Hereinafter, an embodiment will be described with reference to the drawings.

Overview

The embodiment below concerns a resistance change memory such as an MRAM. The resistance change memory includes a resistance change element connected between first and second conductive lines (e.g. a bit line/a source line), and a write buffer which writes data in the resistance change element by passing a write current to the resistance change element through the first and second conductive lines in a writing.

In this resistance change memory, a current/voltage converter which converts the write current into a sense voltage is provided in the write buffer. The write buffer is non-activated when the sense voltage is larger than a first threshold value.

Thus, a write time, that is, a time in which the write current is passed to the resistance change element can be changed, for example, for each column in a memory cell array. More specifically, a write operation can be stopped in a time shorter than a preset write time (fixed), for example, for memory cells requiring no writings (memory cells having data unchanged before and after a writing) and for memory cells which have completed writings earlier.

Therefore, no wasteful current flows in the preset write time (fixed), and a current consumed in a write operation can be reduced.

If a sense amplifier used in a reading is used to detect whether the sense voltage is larger than the first threshold value, overhead associated with the addition of circuits can be suppressed. In this case, the sense amplifier is activated in a writing, and detects whether the sense voltage is larger than the first threshold value.

Here, the first threshold value serves to recognize the state of the resistance change element (memory cell) in a writing, and is therefore different from a second threshold value used in the sense amplifier in a reading.

The write buffer is a driver/sinker which supplies a write current to the resistance change element. The write buffer changes the direction of the write current in accordance with, for example, the value of data. At the same time, the sense amplifier is selectively connected to one of the first and second conductive lines in accordance with the value of data.

Alternatively, the sense amplifier may be connected to one of the first and second conductive lines, and the first threshold value may be changed in accordance with the value of data.

The current/voltage converter functions as a current limiter which always limits the value of the write current, for example, in a writing. In this case, the current limiter preferably sets the value of the write current to a value lower than a minimum value of a distribution of the write current necessary to bring the resistance change element from low resistance to high resistance.

The current/voltage converter may function as a current limiter which limits the value of the write current, for example, at a sense point to convert the write current into a sense voltage.

The sense amplifier has a sense point to detect whether the sense voltage is larger than the first threshold value, for example, within a preset write time.

The sense point includes one of the start of the writing, a point where ⅙ of the write time has passed from the start of the writing, and a point where ⅓ of the write time has passed from the start of the writing.

The sense point is set at the start of the writing to take into consideration the memory cells requiring no writings (memory cells having data unchanged before and after a writing). In this case, no write current flows in these memory cells, so that a current consumed in a writing can be reduced.

The sense point is set at the point where ⅙ of the write time has passed from the start of the writing to take into consideration the fact that 75% or more of the memory cell writing has been completed by this point.

The sense point is set at the point where ⅓ of the write time has passed from the start of the writing to take into consideration the fact that 99% or more of the memory cell writing has been completed by this point.

The write buffer includes, for example, a first P-channel FET and a first N-channel FET that are connected in series between first and second power supply terminals, and a second P-channel FET and a second N-channel FET that are connected in series between the first and second power supply terminals.

The first conductive line is connected to a connection point of the first P-channel FET and the first N-channel FET, and the second conductive line is connected to a connection point of the second P-channel FET and the second N-channel FET.

The current/voltage converter is connected between the first power supply terminal and a connection point of the first 2-channel FET and the second P-channel FET, or connected between the second power supply terminal and a connection point of the first N-channel FET and the second N-channel FET.

In this case, the current/voltage converter includes one of a constant current source, a resistive element, and a clamp diode. The resistance change element is, for example, a magnetoresistive effect element. The magnetoresistive effect element includes a magnetic pinned layer invariable in magnetization direction, a magnetic free layer variable in magnetization direction, and a tunnel barrier layer between the magnetic pinned layer and the magnetic free layer.

Embodiment

FIG. 1 shows major parts of a resistance change memory.

A memory cell array 10 includes an array of resistance change elements (memory cells). A row decoder 11a and a column decoder 11b randomly access the resistance change elements in the memory cell array 10 in accordance with an address signal Add.

A column selection switch 12 serves to electrically connect the memory cell array 10 and a write buffer 13/a sense amplifier 15 to each other in accordance with a signal from the column decoder 11b.

The write buffer 13 writes data DATA_IN into the resistance change elements by passing a write current through the resistance change elements in the memory cell array 10 in a writing. The sense amplifier 15 reads data DATA_OUT from the resistance change elements by passing a read current through the resistance change elements in the memory cell array 10 in a reading.

A control circuit 16 controls the operations of the row decoder 11a, the column decoder 11b, and the write buffer 13/sense amplifier 15.

FIG. 2 shows the relation between the memory cell array, the write buffer, and the sense amplifier.

A unit cell CELL in the memory cell array 10 includes, for example, a resistance change element and a select transistor (FET) that are connected in series. A gate terminal of the select transistor is connected to a word line WL. The word line WL extends in a row direction, and is connected at one end to the row decoder 11a.

The unit cell CELL has one end connected to a bit line BL and the other end connected to a bit line bBL. Both the bit lines BL and bBL extend in a column direction, and are connected at one end to the write buffer 13 and the sense amplifier 15 via column selection transistors (FET) CSW.

Gate terminals of the column selection transistors CSW are connected to the column decoder 11b. The on/off of the column selection transistors CSW is controlled by a column selection signal CSL from the column decoder 11b.

The write buffer 13 is activated by an activation signal ACT1. The write buffer 13 includes a current/voltage converter (CVC) 14. The current/voltage converter 14 has a function to convert the write current into a sense voltage in a writing.

The current/voltage converter 14 may continuously convert the write current into the sense voltage in real time in a writing. The write current can be converted into the sense voltage, for example, by limiting the write current and thereby reducing the voltages of the bit lines BL and bBL to voltages that permit sensing.

In this case, the sense amplifier 15 may continuously detect in real time whether the sense voltage is larger than the first threshold value, that is, whether the writing has been completed. Alternatively, the sense amplifier 15 may detect, at a predetermined sense point within the preset write time (fixed), whether the sense voltage is larger than the first threshold value.

The current/voltage converter 14 may convert the write current into the sense voltage at a predetermined sense point within the preset write time (fixed). As described above, the write current can be converted into the sense voltage, for example, by limiting the write current.

In this case, the sense amplifier 15 detects at the predetermined sense point whether the sense voltage is larger than the first threshold value, that is, whether the writing has been completed.

When the sense voltage is larger than the first threshold value, the sense amplifier 15 outputs a control signal φ which non-activates the write buffer 13.

It is thereby possible to change, for each column in the memory cell array, the write time, that is, the time in which the write current is passed to the resistance change element.

Figure 3:
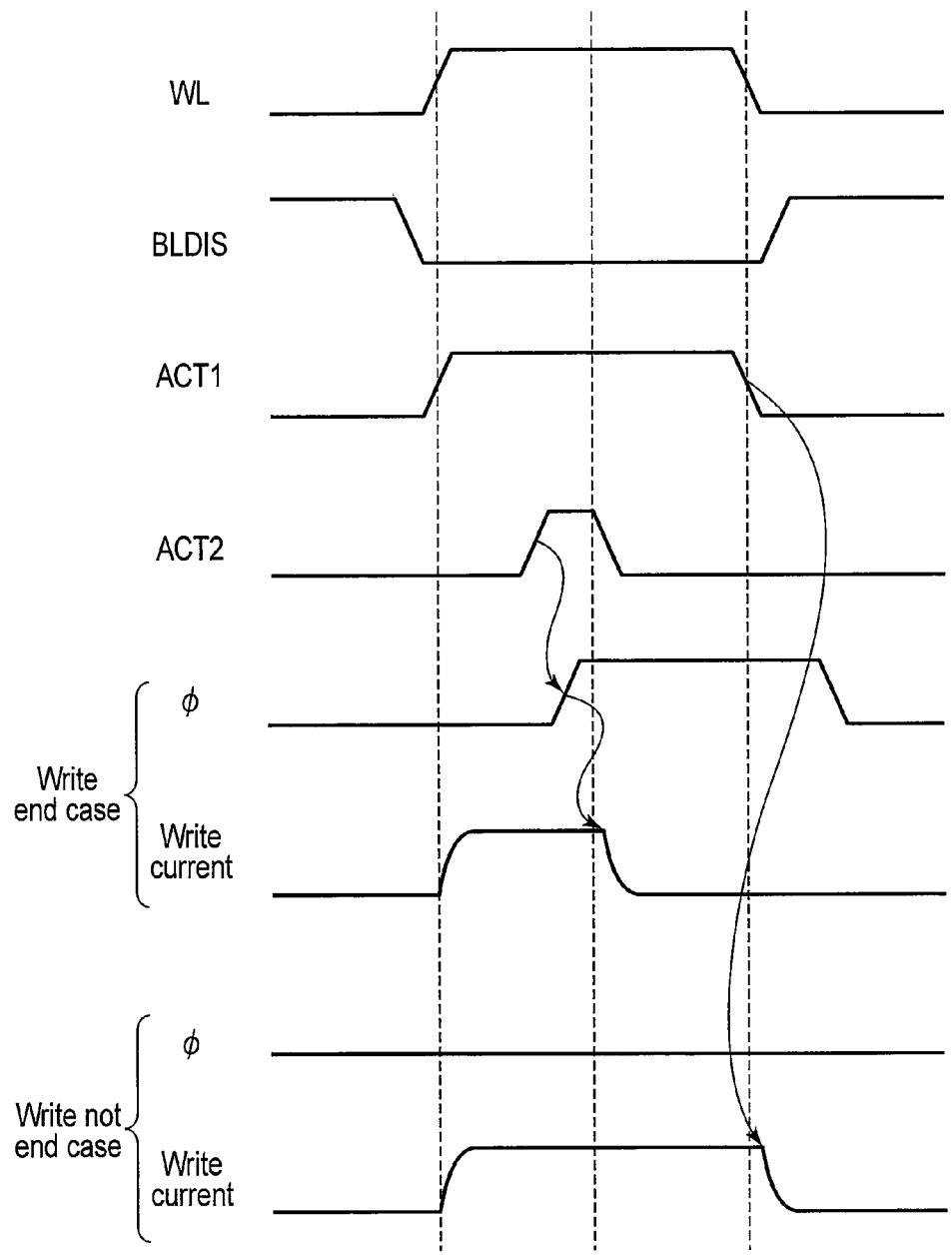
FIG. 3 is a diagram showing operating waveforms according to an embodiment.

For example, as shown in FIG. 3, the word line WL changes to "H" after BLDIS changes to "L". The write buffer 13 is activated by changing ACT1 to "H". As a result, the write current starts to flow.

Thereafter, the sense amplifier 15 is activated by changing ACT2 to "H".

For the memory cells requiring no writings (memory cells having data unchanged before and after a writing) and for the memory cells which have completed writings earlier, the sense amplifier 15 outputs "H" as the control signal φ. The write buffer 13 cuts the write current off by receiving "H" as the control signal φ (Write end case).

On the contrary, for the memory cells which have uncompleted writings, the write current is continue to flow during the predetermined maximum period (Write not end case).

Therefore, no wasteful write current flows, and a current consumed in a write operation can be reduced by changing the period in which the write current flows in each memory cell.

In contrast, as shown in FIG. 4, when a conventional write buffer having no current/voltage converter is used, the write current is continue to flow in the period in which the write buffer is activated (the period in which the ACT1 is "H") whether data has been written into the memory cells.

Therefore, as apparent from FIG. 4, a current consumed in a write operation is increased by generating a wasteful write current.

Figure 5B:
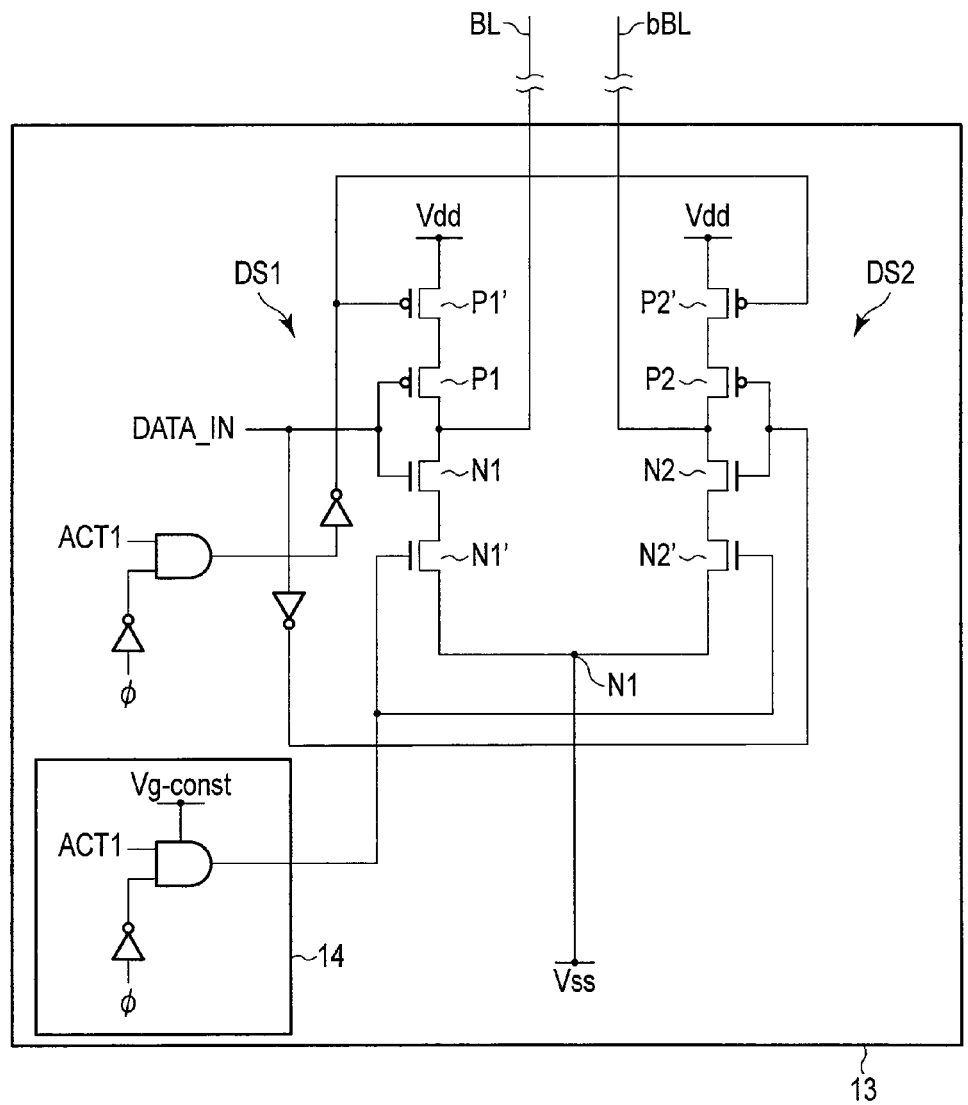

FIGS. 5A and 5B show a configuration example of the write buffer 13 in FIG. 2.

In the example of FIG. 5A, the voltage of the bit lines BL, bBL is set to a voltage value which is possible to sense in the sense amplifier by controlling a current which flows a common node N1. In the example of FIG. 5B, the voltage of the bit lines BL, bBL is set to a voltage value which is possible to sense in the sense amplifier by controlling gate voltages of the two N-channel FETs N1' and N2'. In the example of FIG. 5B, a location of N1 and N2 and a location of N1' and N2' are replaceable.

The write buffer 13 includes write drivers/sinkers DS1 and DS2. The write driver/sinker DS1 is connected to one end of the bit line BL. The write driver/sinker DS2 is connected to one end of the bit line bBL.

The write driver/sinker DS1 includes, for example, two P-channel FETs P1 and P1' and two N-channel FETs N1 and N1' connected in series between a power supply terminal Vdd and a ground terminal Vss.

The write driver/sinker DS2 includes, for example, two P-channel FETs P2 and P2' and two N-channel FETs N2 and N2' connected in series between the power supply terminal Vdd and the ground terminal Vss.

For example, when the activation signal ACT1 is "H" and the control signal φ is "L", the drivers/sinkers DS1 and DS2 are activated.

Thus, when the write data DATA_IN is "H" (="1"), a write current directed from the driver/sinker DS2 to the driver/sinker DS1 flows through the unit cell CELL. When the write data DATA_IN is "L" (="0"), a write current directed from the driver/sinker DS1 to the driver/sinker DS2 flows through the unit cell CELL.

For example, when the activation signal ACT1 is "L" or the control signal φ is "H", the drivers/sinkers DS1 and DS2 are non-activated.

FIGS. 6A, 6B, 7, 8A and 8B show configuration examples of the current/voltage converter 14 in FIG. 5.

In the example shown in FIGS. 6A and 6B, the current/voltage converter 14 comprises a current mirror circuit M and a constant current source I. In this case, for example, the voltages of the bit lines BL and bBL in FIG. 5 when a write current is flowing can be set to a predetermined value in accordance with the state of the memory cells (whether the writing is completed or not).

FIG. 6A is the example of providing one write buffer 13 to one current/voltage converter 14. FIG. 6B is the example of providing a plurality of write buffers 13 to one current/voltage converter 14 commonly. The example of FIG. 6B has an advantage of sharing a circuit in an area X.

In the example shown in FIG. 7, the current/voltage converter 14 comprises a resistive element R1. In this case, for example, the voltages of the bit lines BL and bBL in FIG. 5 when a write current is flowing can be set within a predetermined range in accordance with the state of the memory cells (whether the writing is completed or not).

In the example shown in FIGS. 8A and 8B, the current/voltage converter 14 comprises a clamp diode D and a resistive element R2. In this case, for example, the voltages in accordance with the state of the memory cells (whether the writing is completed or not) can be obtained as a voltage CVCout. The voltage CVCout is detected by the sense amplifier.

FIG. 9 shows the relation between a write time and the number of write complete cells.

The write times of the complete cells (resistance change elements) vary. Here, suppose that the time sufficient to complete writings in all the memory cells is the write time (fixed) T.

However, as apparent from FIG. 9, the number of write complete cells reaches its peak at a point where 1/6 of the write time T has passed from the start of the writing, and 75% or more of the memory cell writing has been completed by this point.

Thus, for example, it is preferable to set a sense point at the point where T/6 has passed from the start of the writing.

99% or more of the memory cell writing is completed by the point where 1/3 of the write time has passed from the start of the writing. Thus, for example, it is preferable to set a sense point at the point where T/3 has passed from the start of the writing.

Setting a sense point at the start of the writing is also effective. This is because there are memory cells requiring no writings (memory cells having data unchanged before and after a writing). In this case, if a sense point is provided at the start of the writing, no write current flows through these memory cells, so that a current consumed in a writing can be reduced.

FIG. 10 shows an example of sense points and power consumption estimations.

In a conventional case, there are 0 sense points, and the power consumption in this case is assumed to be 100%. All flip means power consumption when data in all the memory cells targeted for writings are switched. Half flip means power consumption when data in half of all the memory cells targeted for writings are switched.

In Proposed 1, only one sense point is set at the point where T/3 has passed from the start of the writing. In this case, power consumption in both All flip and Half flip is 33% of that in the conventional case. This allows a considerable reduction in power consumption.

In Proposed 2, two sense points are respectively set at the point where T/6 has passed from the start of the writing and at the point where T/3 has passed from the start of the writing. In this case, power consumption in All flip is 26% of that in the conventional case, and power consumption in Half flip is 22% of that in the conventional case. In Proposed 2, more power consumption can be reduced by the increase of the sense points than in Proposed 1.

In Proposed 3, three sense points are respectively set at the start of the writing, at the point where T/6 has passed from the start of the writing, and at the point where T/3 has passed from the start of the writing. In this case, power consumption in All flip is 26% of that in the conventional case, and power consumption in Half flip is 13% of that in the conventional case. In Proposed 3, more power consumption can be reduced by the increase of the sense points than in Proposed 2.

The effect of the reduction of power consumption increases in proportion to the number of sense points. However, the number of sense points is preferably 3 or less because the increase in the number of sense points complicates the method of controlling these sense points.

FIG. 11 shows an example of current limitation by the current/voltage converter.

In this example, the current limitation by the current/voltage converter sets a value Iconstant of a write current to a value lower than the minimum value of a distribution Iw (P-AP) of a write current (actual value) necessary to bring the resistance change element from low resistance to high resistance.

In order to prevent a write failure, it is preferable to set the value Iconstant of the write current to a value higher than the maximum value of a distribution Ic (P-AP) of a write current (theoretical value) necessary to bring the resistance change element from low resistance to high resistance.

When the current/voltage converter functions as a current limiter which only limits the value of the write current, for example, at the sense point, the value Iconstant of the write current may be lower than the maximum value of the distribution Ic (P-AP).

However, in this case, a switching circuit is needed to connect a note N1 of the write buffer 13 in FIG. 5 directly to the ground terminal Vss without the intervention of the current/voltage converter 14 in a writing (except for the sense point).

At the sense point in a writing, the note N1 of the write buffer 13 in FIG. 5 is connected to the current/voltage converter 14 by the switching circuit.

FIG. 12 and FIG. 13 show examples of sense operations in a writing.

In this example, the sense amplifier (S/A) 15 is used to detect the state of the memory cells (resistance change elements), that is, whether the writing is completed or not at the sense point in the writing. Here, for example, as has already been described in connection with the write operation in FIG. 5, the write buffer changes the direction of the write current in accordance with the value of data.

Under these circumstances, the following work is needed to detect the state of the memory cells in contrast with the sense operation in a reading in which a read current in the same direction is always passed.

Example of Changing the Point to Connect the Sense Amplifier 15 to (FIG. 12)

In order to correctly detect the state of the memory cells, whether to connect the sense amplifier 15 to the bit line BL or to the bit line bBL is selectively determined in accordance with the value of write data.

For example, when a write current which flows from the bit line bBL to the bit line BL is generated by the write buffer 13, the sense amplifier 15 is electrically connected to the bit line bBL. This selection is conducted by a selector 17a which is controlled by a selection signal SEL1a.

At the same time, the sense amplifier 15 is activated by the activation signal ACT2, and then compares the voltage of the bit line bBL with a reference voltage Ref-write. The reference voltage Ref-write or Ref-read is selected by a selector 17b which is controlled by a selection signal SEL1b.

When a write current which flows from the bit line bBL to the bit line BL is generated, the sense amplifier 15 may be electrically connected to the bit line BL.

For example, when a write current which flows from the bit line BL to the bit line bBL is generated by the write buffer 13, the sense amplifier 15 is electrically connected to the bit line BL. This selection is conducted by the selector 17a which is controlled by the selection signal SEL1a.

At the same time, the sense amplifier 15 is activated by the activation signal ACT2, and then compares the voltage of the bit line BL with the reference voltage Ref-write. The reference voltage Ref-write or Ref-read is selected by the selector 17b which is controlled by the selection signal SEL1b.

When a write current which flows from the bit line BL to the bit line bBL is generated, the sense amplifier 15 may be electrically connected to the bit line bBL.

In contrast, in this example, the selector 17a electrically connects the sense amplifier 15 to the bit line bBL in a reading. In this case, a read current which flows from the bit line BL to the bit line bBL is generated if the activation signal ACT2 becomes "H" and its inversion signal bACT2 becomes "L".

At the same time, the sense amplifier 15 is activated by the activation signal ACT2, and then compares the voltage of the bit line BL with the reference voltage Ref-read. The reference voltage Ref-write or Ref-read is selected by the selector 17b which is controlled by the selection signal SEL1b.

In a reading, the selector 17 may electrically connect the sense amplifier 15 to the bit line BL, and a read current may be passed from the bit line bBL to the bit line BL.

The Ref-write and Ref-read have values different from each other.

Example of Changing the Reference Voltage (FIG. 13)

In this example, the sense amplifier 15 is electrically connected to the bit line bBL. In order to correctly detect the state of the memory cells, whether to set the reference voltage of the sense amplifier 15 to the Ref1 or Ref2 is selectively determined in accordance with the value of the write data, that is, the direction of the write current.

For example, when a write current which flows from the bit line bBL to the bit line BL is generated by the write buffer 13, the Ref1 is input to the sense amplifier 15 out of the reference voltages Ref1 and Ref2. This selection is conducted by a selector 18 which is controlled by a selection signal SEL2. At the same time, the sense amplifier 15 is activated by the activation signal ACT2, and then compares the voltage of the bit line bBL with the reference voltage Ref1.

For example, when a write current which flows from the bit line BL to the bit line bBL is generated by the write buffer 13, the Ref2 is input to the sense amplifier 15 out of the reference voltages Ref1 and Ref2. This selection is conducted by the selector 18 which is controlled by the selection signal SEL2. At the same time, the sense amplifier 15 is activated by the activation signal ACT2, and then compares the voltage of the bit line bBL with the reference voltage Ref2.

In contrast, in this example, a reference voltage Ref3 is input to the sense amplifier 15 in a reading. This selection is conducted by the selector 18 which is controlled by the selection signal SEL2. At the same time, the sense amplifier 15 is activated by the activation signal ACT2, and then compares the voltage of the bit line bBL with the reference voltage Ref3. The sense amplifier 15 may be connected to the bit line BL. In this case, the FET to which bACT is input is connected to the bit line bBL.

The Ref1, Ref2, and Ref3 have values different from one another.

Application Example

The resistance change memory according to the present embodiment described above is applicable to, for example, a cache memory in a low-power-consumption processor.

For example, the problem of a conventional resistance change memory simply used as a cache memory is that it consumes a greater amount of current particularly in a writing than an SRAM cache memory (SRAM cache).

In contrast, the resistance change memory according to the present embodiment can change the time of passing a write current for each memory cell or for each column in a writing. Therefore, for the memory cells requiring no writings (memory cells having data unchanged before and after a writing) and for the memory cells which have completed writings earlier, the write operation can be stopped early, and a current consumed in a writing can be reduced.

Consequently, the resistance change memory (e.g. MRAM cache) in this example can consume low power equal to or less than the power consumed by the SRAM cache in a writing.

FIG. 14 shows an example of memories in a processor.

A CPU 31 controls an SRAM 32, a DRAM 33, a flash memory 34, a ROM 35, and an MRAM (magnetic random access memory) 36.

The MRAM 36 can be used in place of any one of the SRAM 32, the DRAM 33, the flash memory 34, and the ROM 35. Accordingly, at least one of the SRAM 32, the DRAM 33, the flash memory 34, and the ROM 35 may be omitted.

The MRAM 36 can be used as a nonvolatile cache (e.g. L2 cache).

FIG. 15 shows the basic structure of a magnetoresistive effect element.

A magnetoresistive element MTJ is an example of the resistance change element in the embodiment described above. The magnetoresistive element MTJ includes a stack structure in which a storage layer (ferromagnetic layer) 1 having perpendicular and variable magnetization, a tunnel barrier layer (insulating layer) 2, and a reference layer (ferromagnetic layer) 3 having perpendicular and invariable magnetization are arranged in this order in a first direction.

Here, the invariable magnetization means that the magnetization direction does not change before and after a writing, and the variable magnetization means that the magnetization direction can change to an opposite direction before and after a writing.

The wiring means a spin transfer writing that passes a spin injection current (spin-polarized electrons) through the magnetoresistive effect element MTJ to apply spin torque to the magnetization of the storage layer 1.

For example, when a spin injection current flows from the storage layer 1 to the reference layer 3, electrons spin-polarized in the same direction as the magnetization of the reference layer 3 are injected into the storage layer 1, and spin torque is applied to the magnetization in the storage layer 1. As a result, the magnetization direction of the storage layer 1 is the same as (parallel to) the magnetization direction of the reference layer 3.

When a spin injection current flows from the reference layer 3 to the storage layer 1, electrons spin-polarized in the direction opposite to the magnetization of the reference layer 3 are brought back into the storage layer 1 among electrons running toward the reference layer 3 from the storage layer 1, and spin torque is applied to the magnetization in the storage layer 1. As a result, the magnetization direction of the storage layer 1 is opposite to (antiparallel to) the magnetization direction of the reference layer 3.

The resistance value of the magnetoresistive effect element MTJ is changed by the magnetoresistive effect depending on the relative magnetization directions of the reference layer 3 and the storage layer 1. That is, the resistance value of the magnetoresistive effect element MTJ is low in the parallel state, and is high in the antiparallel state. The value defined by (R1−R0)/R0 is called a magnetoresistive (MR) ratio, wherein R0 is a resistance value in the parallel state, and R1 is a resistance value in the antiparallel state.

The magnetization of the reference layer 3 is fixed toward the storage layer 1 in this example, but may be fixed in a direction opposite to the storage layer 1. When the magnetoresistive effect element MTJ is disposed on a semiconductor substrate, whether the reference layer 3 or the storage layer 1 is located at the top or bottom is not limited.

For example, the magnetoresistive effect element MTJ is called a top pin type when the reference layer 3 is located above the storage layer 1, and the magnetoresistive effect element MTJ is called a bottom pin type when the reference layer 3 is located under the storage layer 1.

FIG. 16 shows a magnetoresistive effect element having a shift correction layer.

A magnetoresistive effect element MTJ includes a stack structure in which a storage layer (ferromagnetic layer) 1 having perpendicular and variable magnetization, a tunnel barrier layer (insulating layer) 2, and a reference layer (ferromagnetic layer) 3 having perpendicular and invariable magnetization are arranged in this order in a first direction.

The magnetoresistive effect element MTJ also includes, on the side of the reference layer 3, a shift correction layer (ferromagnetic layer) 4 having perpendicular and invariable magnetization. A nonmagnetic layer (e.g. metallic layer) 5 is disposed between the reference layer 3 and the shift correction layer 4.

In this example, the reference layer 3 and the storage layer 1 have perpendicular magnetization. In this case, a leakage magnetic field from the reference layer 3 is in the magnetization direction (perpendicular direction) of the storage layer 1. Therefore, a leakage magnetic field having a large perpendicular component is applied to the storage layer 1. This leakage magnetic field acts in such a direction as to cause the magnetization direction of the storage layer 1 to be the same as (parallel to) the magnetization direction of the reference layer 3.

Therefore, the RH curve of the storage layer 1 is shifted.

That is, it is only necessary to pass a low spin injection current through the magnetoresistive effect element MTJ in order to change the magnetoresistive effect element MTJ from the antiparallel state to the parallel state, whereas it is necessary to pass a high spin injection current through the magnetoresistive effect element MTJ in order to change the magnetoresistive effect element MTJ from the parallel state to the antiparallel state.

The antiparallel state is unstable due to the leakage magnetic field from the reference layer 3.

That is, if the leakage magnetic field is greater than the coercive force of the storage layer 1, the storage layer 1 cannot maintain the antiparallel state. Even when the leakage magnetic field is smaller than the coercive force of the storage layer 1, the magnetization of the storage layer 1 may be switched from the antiparallel state to the parallel state by the leakage magnetic field considering the fluctuation of the magnetization caused by thermal disturbance.

The shift correction layer 4 is provided to solve this problem.

In this example, the reference layer 3 and the shift correction layer 4 are stacked on each other. In this case, the magnetization direction of the shift correction layer 4 is set to be opposite to the magnetization direction of the reference layer 3. As a result, in the storage layer 1, the leakage magnetic field from the reference layer 3 can be offset by a correction magnetic field from the shift correction layer 4, and the shift of the RH curve of the storage layer 1 can be corrected.

FIG. 17 shows a memory cell array of a magnetic random access memory.

The reference signs in FIG. 17 correspond to the reference signs in FIG. 1, FIG. 2, FIG. 5, FIG. 12, and FIG. 13.

A memory cell array 10 includes arrayed memory cells MC.

One memory cell MC includes one magnetoresistive effect element MTJ and one select transistor ST that are connected in series.

The memory cells MC are connected between bit lines BL and bBL. In this example, one end of each memory cell MC on the side of the magnetoresistive effect element MTJ is connected to the bit line BL, and one end of each memory cell MC on the side of the select transistor ST is connected to the bit line bBL.

The bit lines BL and bBL extend in a column direction, and are connected at one end to a write buffer 13/a sense amplifier 15. The write buffer 13 passes a spin injection current (which changes in direction depending on the value of write data) through, for example, the magnetoresistive effect element MTJ in one selected memory cell MC in a writing.

A control terminal (gate electrode) of each memory cell MC on the side of the select transistor ST is connected to a word line WL. The word line WL extends in a row direction, and is connected at one end to a row decoder 11a. The row decoder 11a activates, for example, the word line WL connected to one selected memory cell MC in a writing.

The present embodiment is applicable to the magnetic random access memory described above.

Conclusion

As described above, according to the present embodiment, a current consumed in a write operation can be reduced.

Each of elements in the resistance change memory, for example, the sense amplifier is disclosed in U.S. Pat. No. 7,649,792, and U.S. Patent publication No. 2012/0,286,339, the entire contents of which are incorporated by reference herein.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A resistance change memory comprising:
   a resistance change element connected between first and second conductive lines;
   a write buffer which writes data in the resistance change element by flowing a write current to the resistance change element through the first and second conductive lines in a writing; and
   a current/voltage converter which converts the write current into a sense voltage, the converter provided in the write buffer, the write buffer being non-activated when the sense voltage is larger than a first threshold value.

2. The memory of claim 1, further comprising:
   a sense amplifier which is activated in the writing, and detects whether the sense voltage is larger than the first threshold value.

3. The memory of claim 2,
   wherein the first threshold value is different from a second threshold value used in the sense amplifier in the reading.

4. The memory of claim 2,
   wherein the write buffer changes the direction of the write current in accordance with a value of the data, and the sense amplifier is selectively connected to one of the first and second conductive lines in accordance with the value of the data.

5. The memory of claim 2,
   wherein the write buffer changes the direction of the write current in accordance with a value of the data, and
   the sense amplifier is connected to one of the first and second conductive lines, and changes the first threshold value in accordance with the value of the data.

6. The memory of claim 1,
   wherein the current/voltage converter functions as a current limiter which always limits a value of the write current in the writing.

7. The memory of claim 6,
   wherein the current limiter sets the value of the write current to a value lower than a minimum value of a distribution of the write current necessary to bring the resistance change element from low resistance to high resistance.

8. The memory of claim 1,
   wherein the current/voltage converter functions as a current limiter which limits a value of the write current at a sense point to convert the write current into a sense voltage.

9. The memory of claim 1,
   wherein the sense amplifier has a sense point to detect whether the sense voltage is larger than the first threshold value within a preset write time.

10. The memory of claim 9,
    wherein the sense point includes one of the start of the writing, a point where 1/6 of the write time has passed from the start of the writing, and a point where 1/3 of the write time has passed from the start of the writing.

11. The memory of claim 1,
    wherein the write buffer includes a first P-channel FET and a first N-channel FET that are connected in series between first and second power supply terminals, and a second P-channel FET and a second N-channel FET that are connected in series between the first and second power supply terminals,
    the first conductive line is connected to a connection point of the first P-channel FET and the first N-channel FET,
    the second conductive line is connected to a connection point of the second P-channel FET and the second N-channel FET,
    the current/voltage converter is disposed in at least one of first and second areas,
    the first area is connected between the first power supply terminal and a connection point of the first P-channel FET and the second P-channel FET, and
    the second area is connected between the second power supply terminal and a connection point of the first N-channel FET and the second N-channel FET.

12. The memory of claim 11,
    wherein the current/voltage converter includes one of a constant current source, a resistive effect element, and a clamp diode.

13. The memory of claim 1,
    wherein the resistance change element includes a magnetic pinned layer invariable in magnetization direction, a magnetic free layer variable in magnetization direction, and a tunnel barrier layer between the magnetic pinned layer and the magnetic free layer.

* * * * *